United States Patent
Quinn et al.

(10) Patent No.: US 10,182,513 B2
(45) Date of Patent: Jan. 15, 2019

(54) PHASE CHANGE MATERIAL HEAT SINKS

(71) Applicant: Hamilton Sundstrand Space Systems International, Inc., Windsor Locks, CT (US)

(72) Inventors: Gregory Quinn, Windsor Locks, CT (US); Jesse J. Stieber, Avon, CT (US); Mark A. Zaffetti, Suffield, CT (US)

(73) Assignee: Hamilton Sundstrand Space Systems International, Inc., Windsor Locks, CT (US)

( * ) Notice: Subject to any disclaimer, the term of this patent is extended or adjusted under 35 U.S.C. 154(b) by 471 days.

(21) Appl. No.: 14/598,551

(22) Filed: Jan. 16, 2015

(65) Prior Publication Data

US 2016/0212878 A1 Jul. 21, 2016

(51) Int. Cl.
| | |
|---|---|
| *H05K 7/20* | (2006.01) |
| *F28F 3/12* | (2006.01) |
| *F28D 20/02* | (2006.01) |
| *F28D 20/00* | (2006.01) |
| *F28D 21/00* | (2006.01) |

(52) U.S. Cl.
CPC ......... *H05K 7/2039* (2013.01); *F28D 20/021* (2013.01); *F28F 3/12* (2013.01); *F28D 20/02* (2013.01); *F28D 20/026* (2013.01); *F28D 2020/0008* (2013.01); *F28D 2020/0013* (2013.01); *F28D 2020/0069* (2013.01); *F28D 2021/0029* (2013.01); *Y02E 60/145* (2013.01)

(58) Field of Classification Search
CPC ............ F28D 2020/0008; F28D 20/02; F28D 2021/0029; F28F 2020/0069; F28F 3/02; F28F 3/12; F28F 2265/00; F28F 2265/14; Y02E 60/145

USPC .................. 165/10, 80.4, 139, 170; 361/699
See application file for complete search history.

(56) References Cited

U.S. PATENT DOCUMENTS

| | | | | |
|---|---|---|---|---|
| 2,936,741 A | * | 5/1960 | Telkes ...................... | C09K 5/08 122/32 |
| 5,220,954 A | | 6/1993 | Longardner et al. | |
| 6,220,337 B1 | | 4/2001 | Chen et al. | |

(Continued)

FOREIGN PATENT DOCUMENTS

| | | |
|---|---|---|
| EP | 1156293 A2 | 11/2001 |
| EP | 2543950 A2 | 1/2013 |

(Continued)

OTHER PUBLICATIONS

Search Report dated Jun. 2, 2016 in connection with EP Application No. 16151676.0.

(Continued)

*Primary Examiner* — Frantz Jules
*Assistant Examiner* — Lionel Nouketcha
(74) *Attorney, Agent, or Firm* — Locke Lord LLP; Scott D. Wofsy; Joshua L. Jones

(57) ABSTRACT

A heat sink includes a core body. The core body defines a coolant plenum, sealed first and second chambers, and first and second coolant conduits. The sealed first and second chambers each house a phase change material. The first and second coolant conduits are separated from one another by the coolant plenum and are in fluid communication with the coolant plenum for transferring heat between coolant flowing through the core body and the phase change material.

13 Claims, 5 Drawing Sheets

(56) References Cited

U.S. PATENT DOCUMENTS

| | | | |
|---|---|---|---|
| 6,343,485 B1* | 2/2002 | Duerr | B60H 1/005 |
| | | | 62/430 |
| 6,400,896 B1 | 6/2002 | Longardner | |
| 8,358,000 B2* | 1/2013 | Beaupre | H01L 23/3735 |
| | | | 257/691 |
| 8,967,233 B2* | 3/2015 | Haussmann | F28D 7/08 |
| | | | 165/10 |
| 2006/0050483 A1* | 3/2006 | Wilson | H01L 23/473 |
| | | | 361/702 |
| 2008/0307806 A1* | 12/2008 | Campbell | F24F 5/0017 |
| | | | 62/121 |
| 2011/0132016 A1* | 6/2011 | Chandler | F28D 20/023 |
| | | | 62/259.1 |
| 2012/0111036 A1* | 5/2012 | Campbell | F25B 25/005 |
| | | | 62/115 |
| 2013/0008638 A1* | 1/2013 | Quinn | F28D 20/02 |
| | | | 165/185 |

FOREIGN PATENT DOCUMENTS

| | | | |
|---|---|---|---|
| WO | WO-2011025487 A1 | 3/2011 | |
| WO | WO-2011038891 A2 | 4/2011 | |

OTHER PUBLICATIONS

Knowles, T., Webb G., "Metal/Phase-Change Material Composite Heat sinks", AFWAL-TR-88-3069, (1988).

\* cited by examiner

PHASE CHANGE MATERIAL HEAT SINKS

BACKGROUND OF THE INVENTION

1. Field of the Invention

The present disclosure relates to heat sinks, and more particularly to heat sinks employing phase change materials.

2. Description of Related Art

Heat sinks are commonly used to dissipate heat from devices like electronics, motors, and engines. Some heat sinks employ phase change materials (PCM) such as water, wax, or other materials with suitable melting points to store and release heat energy associated with phase changes, i.e. between a solid phase and a liquid phase and between a liquid phase and a solid phase. The energy associated with such phase changes is generally referred to as the latent heat of fusion or solidification. By conveying heat into and out of the PCM material resident within the heat sink, such heat sinks can store heat for retrieval at a later point in time by melting the PCM material within the heat exchanger.

Such conventional methods and systems have generally been considered satisfactory for their intended purpose. However, there is still a need in the art for improved heat exchangers with improved robustness, including for use in microgravity environments. The present disclosure provides a solution for this need.

SUMMARY OF THE INVENTION

A heat sink includes a core body. The core body defines a coolant plenum, sealed first and second chambers, and first and second coolant conduits. The sealed first and second chambers each house a phase change material. The first and second coolant conduits are separated from one another by the coolant plenum and are in fluid communication with the coolant plenum for transferring heat between coolant flowing through the core body and the phase change material.

In certain embodiments, the heat sink can include a flat plate with opposed plenum and chamber surfaces. The plenum surface can bound the coolant plenum and the chamber surface can bound the first chamber. An open-celled body can be connected to the chamber surface and can be disposed within the first chamber. The flat plate can be a first flat plate, and the core body can include a second flat plate with opposed plenum and chamber surfaces, the plenum surface bounding the coolant plenum and the chamber surface bounding the second sealed chamber. The phase change material can include water, wax, salt or any other suitable phase change material, and can be in thermal communication with fluid traversing the coolant plenum and/or coolant conduit(s) through the open-celled body.

In accordance with certain embodiments, the first and second coolant conduits can each have a wall with opposed passage and chamber surfaces. The chamber surface of the first coolant conduit can bound an interior of the first chamber and the chamber surface of the second coolant conduit can bound an interior of the second chamber. Either or both of the passage surfaces of the coolant conduits can define a flow area with a circular shape, D-channel, or any other suitable shape. It is contemplated that a header can be defined by the core body and can fluidly couple the first and second coolant conduits with the coolant plenum. The header can span widths of each of the coolant plenum and first and second coolant conduits. The header can define a flow passage that is angled relative to flow passages defined within either or both of the coolant conduits as well as the coolant plenum, and can be angled at a 90-degree angle or any suitable angle.

It is also contemplated that in certain embodiments the core body can define a coolant outlet that is in fluid communication with the coolant plenum. The coolant outlet can be on a side of the core body opposite the header. The core body can define a coolant inlet that is in fluid communication with the coolant conduit and which is on a side of the core body opposite the header. The inlet can be a first coolant inlet in fluid communication with the first coolant conduit, and the core body can further define a second coolant inlet in fluid communication with the second coolant conduit. The second coolant conduit can also be disposed on the core body end opposite the header.

A vehicle cooling circuit includes a coolant source in fluid communication with a heat sink through a coolant supply conduit and a coolant return conduit. The heat sink includes a core body as described above with a plurality of coolant inlets connected to the coolant supply conduit and a coolant outlet connected to the coolant return conduit.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
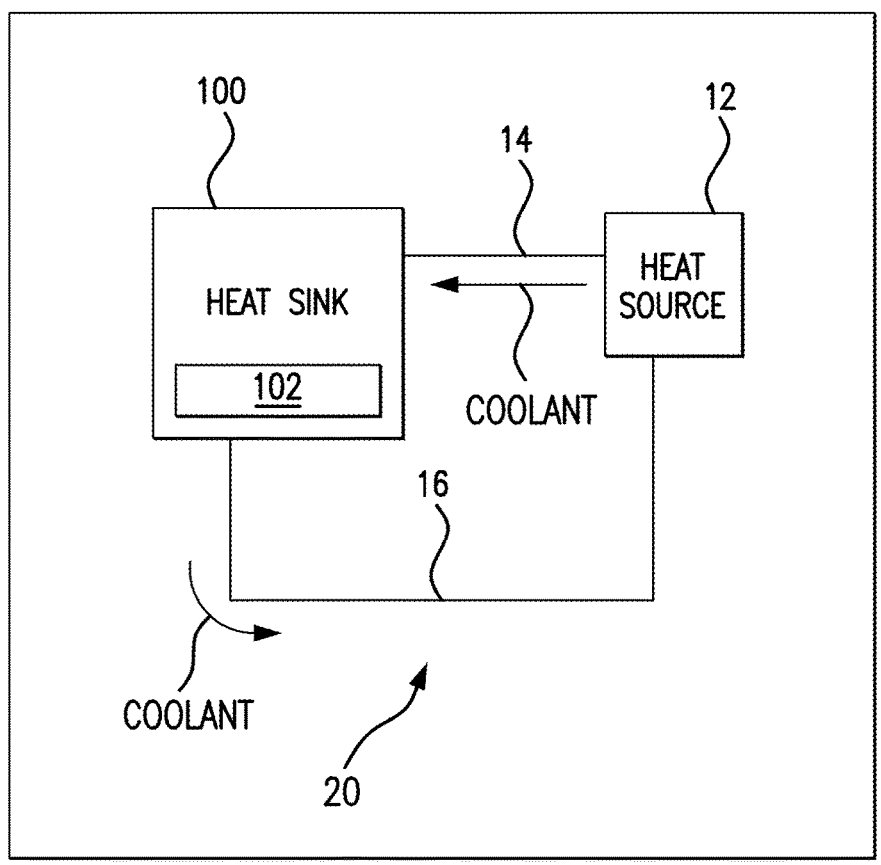
FIG. 1 is a schematic view of an exemplary embodiment of a vehicle cooling circuit constructed in accordance with the present disclosure, showing a coolant circuit, a heat sink, and a heat sink core body disposed within the heat sink.

Reference will now be made to the drawings wherein like reference numerals identify similar structural features or aspects of the subject disclosure. For purposes of explanation and illustration, and not limitation, a partial view of an exemplary embodiment of a heat sink in accordance with the disclosure is shown in FIG. 1 and is designated generally by reference character 100. Other embodiments of heat sinks in accordance with the disclosure, or aspects thereof, are provided in FIGS. 2-7, as will be described. The systems and methods described herein can be used for thermal management systems for vehicles, such as vehicles configured for operation in microgravity environments.

Heat sink 100 includes a core body 102 and is incorporated within a vehicle 10. Vehicle 10 can be a vehicle suitable for operation in a microgravity environment, such as space, and includes a coolant circuit 20. Coolant circuit 20 interconnects heat sink 100 and a heat source 12, and includes a supply conduit 14 for flowing coolant from heat source 12 to heat sink 100 and a return conduit 16 for returning coolant from heat sink 100 to heat source 12. In this respect coolant circuit 20 places heat source 12 in fluid communication with heat sink 100 such that heat can flow between heat sink 100 and heat source 12. Heat source 12 may be an electrical component associated with vehicle 10, and coolant circuit 20 may be configured to both deposit heat rejected from heat source 12 into heat sink 100 and return previously rejected heat from heat sink 100 to heat source 12 depending on the operating environs of vehicle 10, such as when vehicle 10 moves into and out of direct sunlight.

Figure 2:
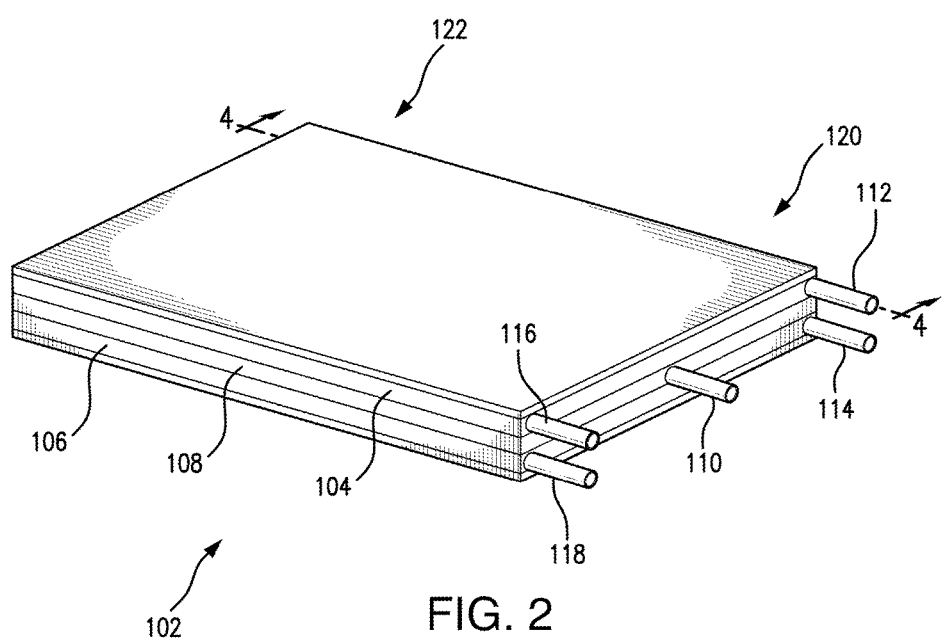
FIG. 2 is a perspective view of a core body for the heat sink of FIG. 1, showing the coolant inlets, coolant outlet, sealed chambers, and coolant plenum of the core body.

With reference to FIG. 2, core body 102 is shown. Core body 102 defines a first chamber 104, a second chamber 106, and a coolant plenum 108. First chamber 104 and second chamber 106 are disposed on opposite sides of coolant plenum 108 such that coolant plenum 108 separates first chamber 104 from second chamber 106. Core body 102 also defines a coolant outlet 110, a first coolant inlet 112, and a second coolant inlet 114. Coolant outlet 110 is disposed on coolant plenum 108 and is in fluid communication with an interior of coolant plenum 108. First coolant inlet 112 is disposed on first chamber 104 and in is fluid communication with coolant outlet 110. Second coolant inlet 114 is disposed on second chamber 106 and in also in fluid communication with coolant outlet 110.

As illustrated in FIG. 2, core body 102 additionally defines a third coolant inlet 116 and a fourth coolant inlet 118. Third coolant inlet 116 is disposed on first chamber 104 and is in fluid communication with coolant outlet 110. Fourth coolant inlet 118 is disposed on second chamber 106 and is in fluid communication with coolant outlet 110. Each of the coolant inlets and the coolant outlet are disposed on a first end 120 of core body 102, first end 120 being opposite a second end 122 of core body 102, such that core body 102 provides an internal coolant flow path within core body 102. As will be appreciated, core body 102 can have any number of coolant chambers with inlets and coolant plenums with outlets, as suitable for an intended application.

Figure 3:
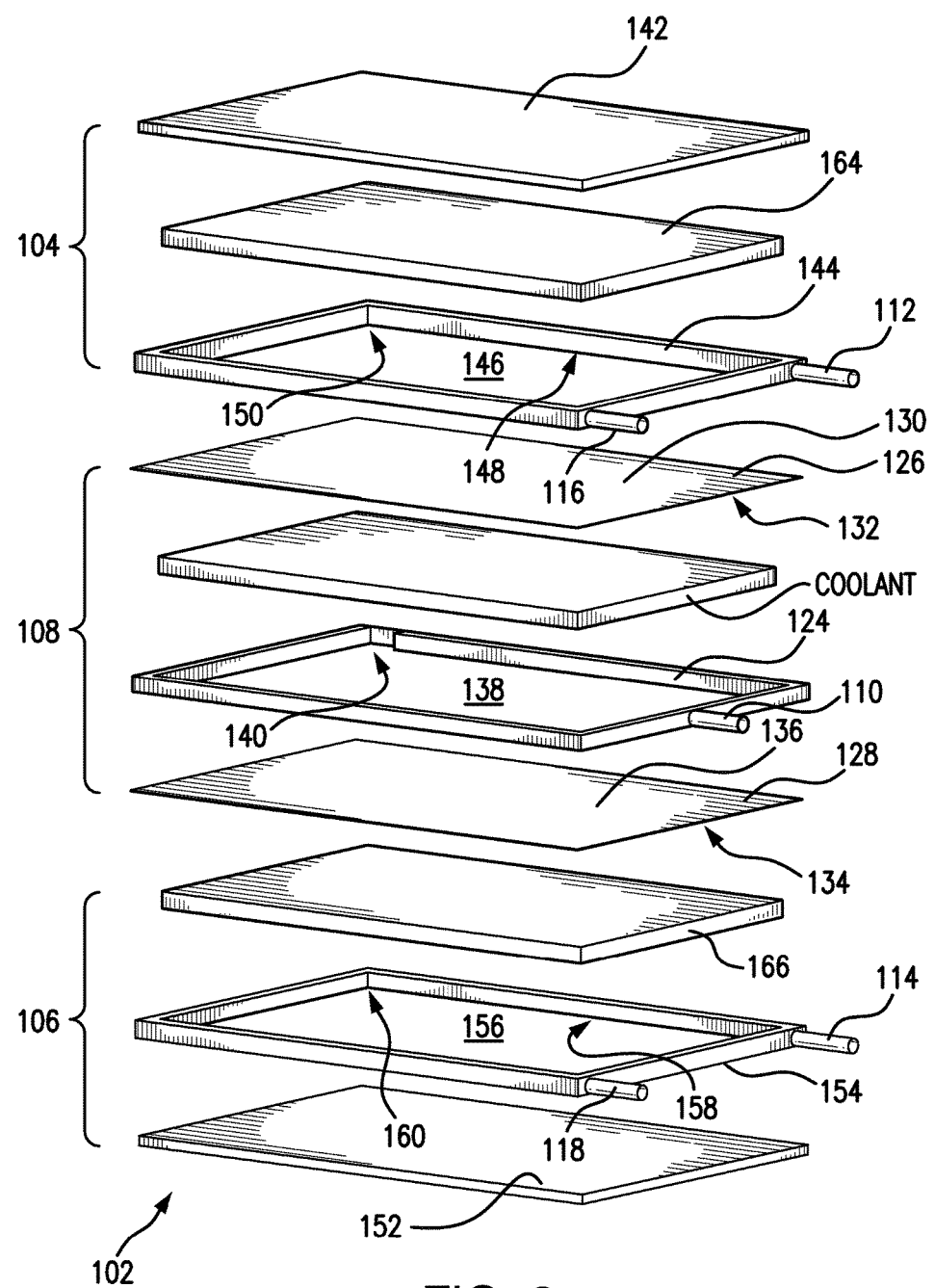
FIG. 3 is an exploded perspective view of the core body of the heat sink of FIG. 1, showing the phase change materials housed within the core body.

With reference to FIG. 3, core body 102 is shown in an exploded view. Coolant plenum 108 includes a lateral member 124, a first flat plate 126, and a second flat plate 128. First flat plate 126 includes a chamber surface 130 and a plenum surface 132 opposite chamber surface 130. Second flat plate 128 also includes a chamber surface 134 and a plenum surface 136 opposite chamber surface 134. First flat plate 126 and second flat plate 128 both connect to lateral member 124 such that chamber surface 130 of first flat plate 126 faces chamber surface 134 of second flat plate 128, thereby defining therein a coolant plenum space 138. Coolant outlet 110 extends through lateral member 124 and is in fluid communication with traversing coolant plenum space 138. A header portion 140 defined within an interior portion of lateral member 124 is also in fluid communication with coolant plenum space 138. Coolant enters coolant plenum 108 through header portion 140, traverses coolant plenum space 138, and exits core body 102 through coolant outlet 110.

As also illustrated, first chamber 104 includes a top member 142 and a lateral member 144. A plenum facing surface of top member 142, lateral member 144, and chamber surface 130 of first flat plate 126 define a first chamber volume 146. First chamber sealed volume 146 is sealed with respect to the external environment and coolant circulation passages defined with core body 102, and a first body 164 including a phase change material is disposed therein. First body 164 may include water, wax or like material. Lateral member 144 defines within its interior a first coolant conduit 148 (shown in FIG. 4) that extends between first coolant inlet 112 and a header portion 150 defined within an interior portion of lateral member 144 within. As illustrated in FIG. 3, a similar cooling conduit is disposed on an opposite side of first chamber 104 that is in fluid communication with third cooling inlet 116.

As further illustrated, second chamber 106 includes a bottom member 152 and a lateral member 154. A plenum-facing surface of bottom member 152, lateral member 154, and chamber surface 134 of second flat plate 128 define a second chamber volume 156. Second chamber volume 156 is also sealed with respect to the external environment and coolant circulation passages defined within core body 102, and a second body 166 including a phase change material is disposed therein. Second body 166 may include the same material as first body, such as water, wax, or any other material(s) with suitable melting points to store and release heat energy by associated phase changes. Alternative, second body 166 can include a phase change material that is different from the phase change material included in first body 164, as suitable for a given application. Lateral member 154 defines within an interior of at least its longitudinal portion a second coolant conduit 158 (shown in FIG. 4) that extends between second coolant inlet 114 and a header portion 160 defined within an interior portion of lateral member 154. As illustrated in FIG. 3, a similar coolant conduit disposed on an opposite side of second chamber 106 that is in fluid communication with fourth cooling inlet 118.

Figure 4:
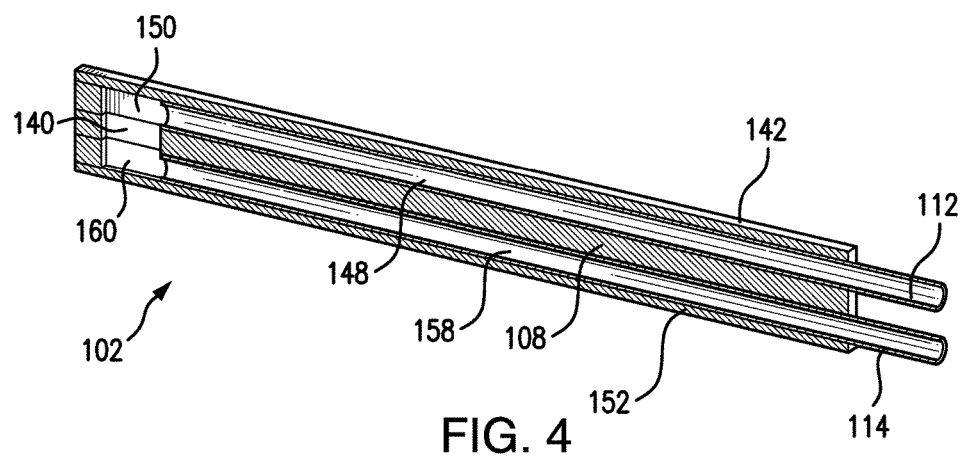
FIG. 4 is a cross-sectional perspective view of the core body of FIG. 1 taken through the first and second coolant conduits, showing flow passages defined within the coolant conduits.

With reference to FIG. 4, core body 102 is shown in a longitudinal cross-section through lateral edges of first chamber 104, coolant plenum 108, and second chamber 106. It is to be understood and appreciated that the laterally opposite side of core body 102 having third coolant inlet 116 and fourth coolant inlet 118 is similar in construction to that illustrated in FIG. 4.

Lateral member 144 of first chamber 104 is hollow and defines therein first coolant conduit 148. First coolant conduit 148 defines a coolant flow passage that extends from first coolant inlet 112 to first chamber header portion 150. Header portion 150 and first coolant conduit 148 are each fluidly isolated from sealed volume 146 (shown in FIG. 3) and in thermal communication with the phase change material housed therein. Header portion 150 is coupled to header portion 140 of coolant plenum 108. In this respect the coupling of header portion 150 and header portion 140 allows coolant received from first coolant conduit to enter coolant plenum space 138 by directing the longitudinal flow centrally, toward coolant plenum 108 and away from top member 142.

Lateral member 154 of second chamber 106 is similar in construction to lateral member 144. In this respect lateral member 154 of second chamber 106 is hollow and defines within its interior a second coolant conduit 158. Second coolant conduit 158 defines a coolant flow passage that extends from second coolant inlet 114 to second chamber header portion 160. Header portion 160 and second coolant conduit 158 are each fluidly isolated from sealed chamber volume 156 (shown in FIG. 3) and in thermal communication with the phase change material housed therein. Header portion 160 is coupled to header portion 140 such that coolant received from second coolant conduit 158 enters coolant plenum space 138 by directing the longitudinal flow centrally, toward coolant plenum 108 and away from bottom member 152.

Figure 5:
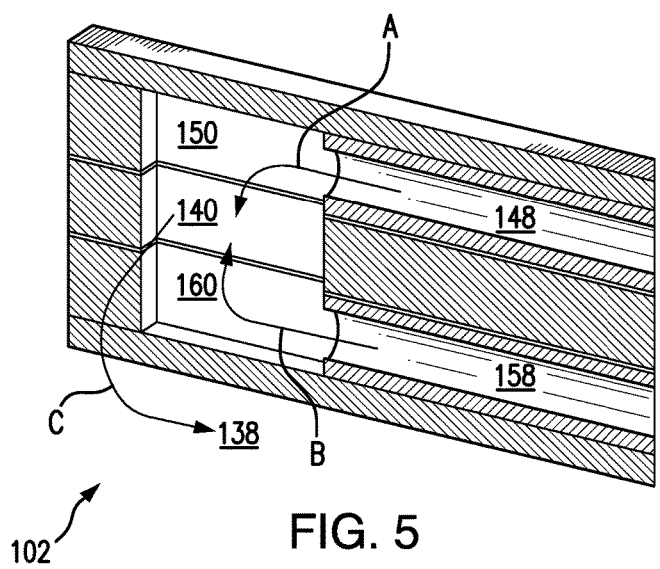
FIG. 5 is a cross-sectional perspective view of an end of the core body of FIG. 1, showing a coolant header defined within the core body.

With reference to FIG. 5, coolant flow through the core body coolant header are shown. A first coolant flow A traverses first coolant conduit 148 and enters header portion 150. Header portion 150 redirects first coolant flow A centrally, toward header portion 160, and into header portion 140. A second coolant flow B traverses second coolant conduit 158 and enters header portion 160. Header portion 160 redirects second coolant flow B centrally, toward header portion 150, and into header portion 140 where coolant flow A and coolant flow B intermix. Because first and second coolant flows A and B are of substantially equivalent pressure, first and second flows combine into a third flow C that enters coolant plenum 108, flowing through coolant plenum space 138 and exiting core body 102 through coolant outlet 110 (shown in FIG. 3).

Figure 6:
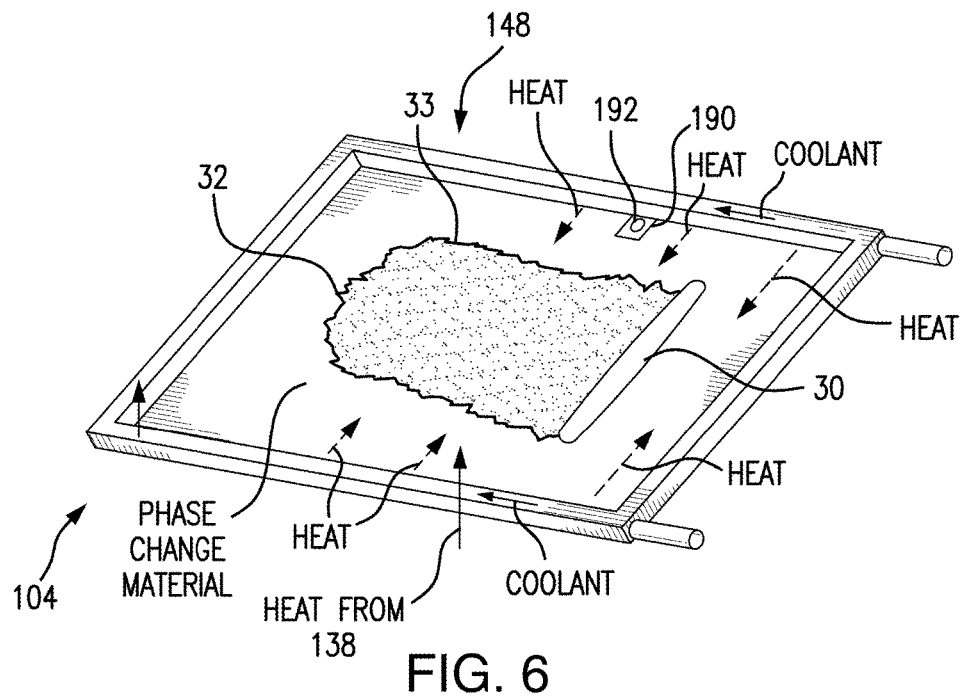
FIG. 6 is cross-sectional perspective view of the core body of FIG. 1, showing heat flow from coolant traversing a first chamber of the core body in a phase change material disposed therein.

With reference to FIG. 6, heat flow is shown into first chamber 104. As will be appreciated, one or more ulage spaces 30 can be defined within the phase change material disposed within sealed volume 146. It is to be appreciate that one or more ulage spaces can be found anywhere the chambers. As illustrated, the ulage space is disposed on a side of the chamber opposite the melt front, posing a greater concern than other possible locations within the chambers. As coolant flows through the coolant conduits, e.g. first coolant conduit 148, a secondary melt front 33 develops as heat transfers from the coolant and into the phase change material. The coolant traverses the first phase change material body twice; first, while traversing first coolant conduit 148; and second, while traversing coolant plenum space 138 (shown in FIG. 3). Heat transfers from coolant flow C (shown in FIG. 5) upwards relative to the FIG. 6. Heat transfer from coolant flow C creates a primary melt front 32. Secondary melt front 33 develops from thermal communication between first coolant conduit 148 and the phase change material, bridging ulage space 30 with primary melt front 32, thereby relieving pressure within sealed volume 146.

Heat transfer can further be improved by incorporation of an open-celled body 190 within first chamber volume 146. Open celled body 190 may be connected to either or both of lateral member 144 and first flat plate 126, and includes a cell 192 within which phase change material is disposed. It is contemplated that the portions of open-celled body 190 surrounding the phase change material be formed from a thermally conductive wire, mesh, fins, or foam-like structure, thereby providing a thermal conduit into the phase change material. This facilitates formation of fissures within the phase change material through which liquid material may migrate, for example from regions of relatively high pressure adjacent to melt front 32, to regions of low pressure, i.e. ulage space 30.

Figure 7:
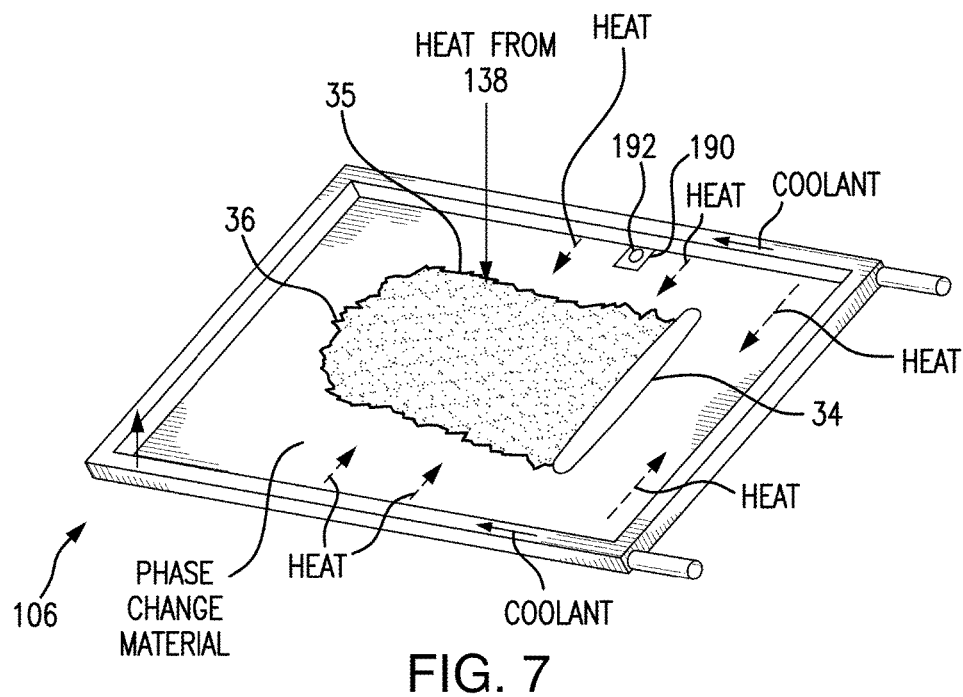
FIG. 7 is cross-sectional perspective view of the core body of FIG. 1, showing heat flow from coolant traversing a second chamber of the core body in a phase change material disposed therein.

With reference to FIG. 7, heat flow is shown into second chamber 106. Heat flow into second chamber 106 is similar to that of heat flow into first chamber 104 with the difference that heat flow from coolant flow C (shown in FIG. 5) is received from the opposite direction from which first chamber receives heat from coolant flow C. Similar to the above-described bridging process within first chamber 104 (shown in FIG. 6), a secondary melt front 35 develops from thermal communication between second coolant conduit 158 and the phase change material, bridging a ulage space 34 with melt front 36, thereby relieving pressure within sealed chamber volume 156. As will also be appreciated, heat can also flow from the phase change material within the chambers and into coolant traversing the heat sink, thereby providing heat storage capability to vehicles incorporating the heat sinks as described above.

Volumetric change of phase change materials when undergoing state changes can present pressure-related challenges to heat sinks with sealed chambers housing such materials. One solution to the tendency of such materials to expand and contract while undergoing phase change is to dispose a void within the chamber housing the phase change material. While generally satisfactory, in practice, such void space may be cut off from the melt front by solid phase change material, allowing pressures to rise within the hydraulically locked melting phase change material.

In embodiments of heat sink cores described herein, counter flows of a heat transport fluid (coolant) create a thermal shunt within the sealed chamber housing the phase change material. This creates and maintains a volume of liquid phase change material within the sealed chamber that provides an avenue through which pressure can be relieved by liquid flow from regions of relatively high hydraulic pressure to regions of relatively low hydraulic pressure. This can prevent internal pressure from building to levels sufficient to breach the sealed chamber housing the phase change material. In certain embodiments, the arrangement of the heat sink core body described herein allow for the thermal shunt to be effective in relatively large heat sinks using less mass than solid shunts.

The methods and systems of the present disclosure, as described above and shown in the drawings, provide for heat sinks with superior properties including pressure relief within sealed chambers housing a phase change material. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:
1. A heat sink, comprising:
 a core body with a first end and an opposite second end, the core body having:
  a coolant plenum;
  a first chamber sealed from the coolant plenum and housing a phase change material;
  a second chamber sealed from the coolant plenum and housing a phase change material, the second chamber spaced apart from the first chamber by the coolant plenum;
  a single coolant outlet arranged on the first end of the core body;
  a header arranged on the second end of the core body and within the core body, the header in fluid communication with the coolant outlet through the coolant plenum;
  a first coolant inlet arranged on the first end of the core body and fluidly coupled to the header by a first coolant conduit;

a second coolant inlet arranged on the first end of the core body and fluidly coupled to the header by a second coolant conduit;

a third coolant inlet arranged on the first end of the core body and fluidly coupled to the header by a third coolant conduit; and a fourth coolant inlet arranged on the first end of the core body and fluidly coupled to the header by a fourth coolant conduit, wherein the first coolant conduit and the third coolant conduit longitudinally bound the first sealed chamber, wherein the second coolant conduit and the fourth coolant conduit longitudinally bound the second sealed chamber, and wherein the first coolant conduit, the second coolant conduit, the third coolant conduit, and the fourth coolant conduit are fluidly connected to the header so that fluid flowing within each of the conduits toward the second end of the core body merge within the header, is directed by the header to the first end of the core body, and discharges from the coolant plenum via the single outlet on the first end of the core body, and wherein the header is defined by a combination of the first coolant chamber, the coolant plenum, and the second coolant chamber in a sealed arrangement at the second end of the core body.

2. The heat sink as recited in claim 1, wherein the core body includes a flat plate with opposed plenum and chamber surfaces, the chamber surface bounding an interior of the first chamber.

3. The heat sink as recited in claim 2, further including an open-celled body connected to the chamber surface of the flat plate and disposed within the first chamber.

4. The heat sink as recited in claim 1, wherein a passage surface of the first coolant conduit defines a flow area with a circular shape or a D-channel.

5. The heat sink as recited in claim 1, wherein the header spans respective widths of the first chamber, the coolant plenum, and the second chamber.

6. The heat sink as recited in claim 1, wherein the header defines a header flow passage angled relative to the first and second coolant conduits.

7. The heat sink as recited in claim 1, wherein the header is substantially orthogonal relative to at least one of the first and second coolant conduits.

8. The heat sink as recited in claim 1, wherein the outlet is in fluid communication with the header and is disposed on a side of the core body opposite the header.

9. The heat sink as recited in claim 1, wherein the inlets are in fluid communication with the header through their corresponding coolant conduit and are disposed on a side of the core body opposite the header.

10. The heat sink as recited in claim 1, wherein the phase change material includes at least one of water, wax, and salt.

11. The heat sink as recited in claim 1, wherein the phase change material housed in the first chamber is wax.

12. The heat sink as recited in claim 1, wherein the phase change material housed in the second chamber is wax.

13. The heat sink as recited in claim 1, wherein the phase change material housed in the first chamber is wax, wherein the phase change material housed in the second chamber is wax.

* * * * *